United States Patent
Dutt et al.

(10) Patent No.: US 7,519,933 B2
(45) Date of Patent: Apr. 14, 2009

(54) CONVERGING REPEATER METHODOLOGY FOR CHANNEL-LIMITED SOC MICROPROCESSORS

(75) Inventors: Arjun Dutt, Mountain View, CA (US); Dajen Huang, Sunnyvale, CA (US); Yi Wu, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 301 days.

(21) Appl. No.: 11/524,820

(22) Filed: Sep. 21, 2006

(65) Prior Publication Data

US 2008/0077899 A1 Mar. 27, 2008

(51) Int. Cl.
*G06F 17/50* (2006.01)
(52) U.S. Cl. .......................................... 716/10; 716/9
(58) Field of Classification Search ................ 716/8–12
See application file for complete search history.

(56) References Cited

U.S. PATENT DOCUMENTS

| | | | | |
|---|---|---|---|---|
| 6,463,574 | B1 * | 10/2002 | Culetu et al. | 716/8 |
| 6,701,506 | B1 * | 3/2004 | Srinivasan et al. | 716/10 |
| 7,350,173 | B1 * | 3/2008 | Ang et al. | 716/8 |
| 2005/0138589 | A1 * | 6/2005 | Alpert et al. | 716/10 |

* cited by examiner

*Primary Examiner*—Jack Chiang
*Assistant Examiner*—Binh C Tat
(74) *Attorney, Agent, or Firm*—Osha • Liang LLP (57) ABSTRACT

A method for inserting repeaters in an integrated circuit includes establishing a set of initial constraints for a given set of buses; assigning at least one repeater corresponding to each of the given set of buses based on the set of initial constraints; progressively relaxing the set of initial constraints to form a new set of constraints for a new set of buses and assigning at least one repeater corresponding to each of the new set of buses based on the new set of constraints; and routing assigned repeaters to each of the new set of buses in the integrated circuit.

11 Claims, 8 Drawing Sheets

CONVERGING REPEATER METHODOLOGY FOR CHANNEL-LIMITED SOC MICROPROCESSORS

BACKGROUND OF INVENTION

To improve the performance of an integrated circuit ("IC"), a designer must pay particular attention to factors such as the propagation delay time of critical signals propagated on particular paths. Signal propagation delay is a significant factor in high performance IC design. This is primarily due to the resistive and capacitive components of the metal interconnects (also known in the art as "buses," "bus lines," "nets," or "wires") between circuit elements of the IC. In general, signal propagation delay increases as a function of bus length. Signal propagation delay not only slows performance of an IC, but also if the signal propagation delay exceeds the period of an IC clock, the IC will not function properly.

Similarly, signal transition time is another significant factor in high performance IC design. The resistive and capacitive components of the buses also affect transition time of the signals being propagated. A transition time that is too long permits noise to couple to the signal, which can cause unexpected transitions of the signal. Additionally, a long transition time may worsen the propagation delay of a signal. As a result, too long of a signal transition time may cause functional errors or failures.

IC designers address the issue of signal propagation delay and signal transition time using repeaters. Inserting one or more repeater amplifiers (i.e., "repeaters"), also known as drivers or buffers, into a long bus path can decrease the resistive-capacitive delay and degradation of the propagated signal. A repeater is generally a circuit such as, for example, an inverter or a set of cascaded inverters. Thus, where a critical bus is relatively long, the signal propagation delay associated with that critical bus can be decreased by rerouting the path to include a repeater.

Conventionally, repeater placement in an IC has been an iterative process, evaluated by a designer. While software tools for modeling and simulating circuits exist, they do not automatically determine where, and to what extent, repeaters should be placed within a circuit.

Because critical paths are typically identified while designing buses for an IC, critical paths are usually not determined until after the block-level architectures are completed. If signals are routed in the entire chip using available metal layers including lower metal layers, repeater resources may be exhausted quickly without resolving IC timing. On the other hand, if signals are virtually routed to converge on timing for the entire chip, they may be physically unroutable. Further, continuously shrinking die sizes and increasing numbers of gates used in System-On-Chip (SOC) microprocessors have shrunk the floor plan channels. Accordingly, designers seek to place only as many repeaters as necessary on an integrated circuit to avoid timing malfunctions, while avoiding the consumption of too much space on the IC.

SUMMARY OF INVENTION

In general, in one aspect, one or more embodiments of the present invention relate to a method for inserting repeaters in an integrated circuit, comprising: establishing a set of initial constraints for a given set of buses; assigning at least one repeater corresponding to each of the given set of buses based on the set of initial constraints; progressively relaxing the set of initial constraints to form a new set of constraints for a new set of buses and assigning at least one repeater corresponding to each of the new set of buses based on the new set of constraints; and routing assigned repeaters to each of the new set of buses in the integrated circuit.

Other aspects and advantages of the invention will be apparent from the following description and the appended claims.

DETAILED DESCRIPTION

Exemplary embodiments of the invention will be described with reference to the accompanying figures. Like items in the figures are shown with the same reference numbers. Further, the use of "ST" in the figures is equivalent to the use of "Step" in the detailed description below.

In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Embodiments of the invention relate to methods and apparatuses for integrated circuit design. More specifically, one or more embodiments of the invention relate to methods and apparatuses for inserting repeaters in an integrated circuit.

Embodiments of the present invention converge timing, repeater, and bus route solutions in a prioritized manner. In one or more embodiments of the invention, the methodology treats critical buses preferentially to close timing first and subsequently closes the route on sub-critical buses. There are four broad steps in this methodology: repeater bank layout and allocation, repeater insertion, priority-based repeater routing, and repeater insertion on low-priority routes. This methodology may be implemented on virtually any integrated circuit design, including, for example, a channel-limited system-on-chip (SOC) microprocessor.

Figure 1:
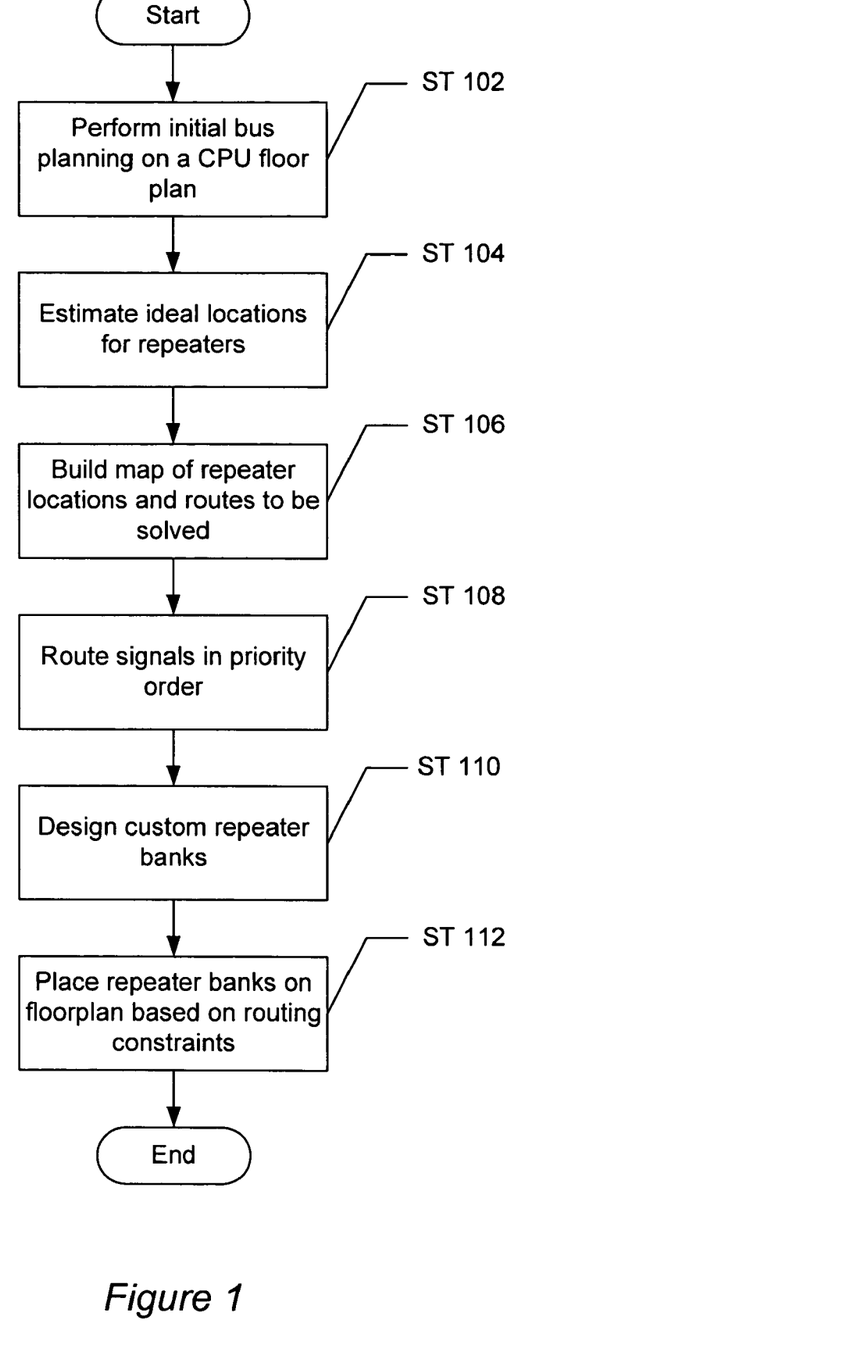
FIG. 1 shows a method for placing repeaters in accordance with one or more embodiments of the invention.

As seen with respect to FIG. 1, in one or more embodiments of the invention, custom repeater bank layout and allocation begins with bus planning on a CPU floor plan (Step 102). Bus planning is performed for major buses in an integrated circuit. A number of factors affect bus planning, including bus wire lengths, the proximity of repeaters to critical buses, and the physical availability of space to place repeater banks. Based on such factors, a designer can decide where repeaters need to be for critical buses and plan where repeaters need to be located. Bus planning is followed by estimating ideal locations for repeaters on these buses (Step 104) to get an idea of how many repeaters are required and where they should be located. Based on the estimation, an initial map of repeater locations, the number of repeaters, and the corresponding bus routes to be solved is built (Step 106).

Before attempting to solve a repeater solution for global signals propagated in various buses, the signals are sorted into various bins based on their assessed priority in terms of timing criticality. These bins range from various levels of pre-routed buses to completely automatic sub-critical buses. In other words, the higher the priority of the signal a bus propagates, the higher the priority of the bin to which that bus is assigned.

Routing the chip is performed starting from the highest priority bins. Then, bins are created based on bus route layer and bus route topology, and custom repeater banks that are able to connect to these routes with minimum difficulty are designed. These custom banks are placed in the floor plan based on routing constraints (Step 112). This forms the basis for the initial repeater placement and floor plan.

Solving repeaters on a bus broadly involves specifying input transition times, repeater window size, and metal crossing constraints. Input transition time is an upper limit for the length that a bus should be repeated. In other words, this specifies at what edge rate of a signal a repeater should be placed. Thus, a more critical net implies that more repeaters are necessary along its length, up to a limit determined by a designer. Repeater window size specifies the boundary distance from a repeater bank that can be assigned to a bus. This value may be interpreted in terms of two-dimensional distance from a repeater. Metal crossing constraints refer to the metal layers in which buses are located and the corresponding metal layer pins of repeaters that will be considered for repeater assignment. In other words, this is an indication of how many layers can be traversed to connect a repeater to a metal crossing. Metal crossing is associated with the cost of a repeater (explained in detail below). High priority buses typically have stringent input transition times, smaller repeater window sizes, and specific metal crossing constraints for repeaters. Conversely, low priority buses typically have less stringent input transition times, larger repeater window sizes, and less specific metal crossing constraints for repeaters.

Figure 2:
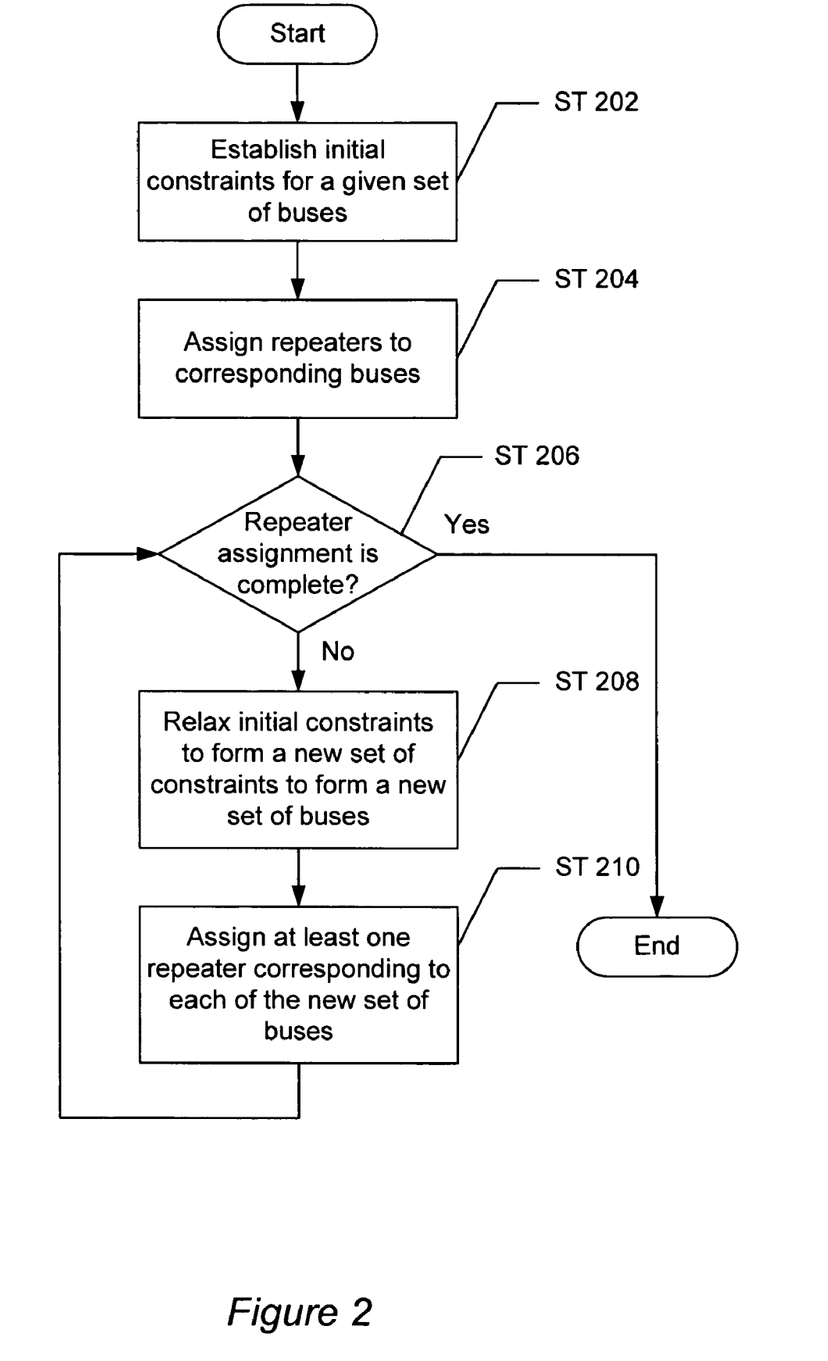
FIG. 2 shows a method for assigning repeaters in accordance with one or more embodiments of the invention.

FIG. 2 shows a method for assigning repeaters in accordance with one or more embodiments of the invention. This approach is known as a converging methodology. Assigning repeaters starts on high-priority critical buses with stringent input transition times, small repeater window size, and specific metal crossing constraints (these constraints require high-cost repeater resources). This methodology will expand to include lower-priority buses. In Step 202, initial constraints for a given set of buses (i.e., high-priority buses) are established. Then, one or more repeaters are assigned to each bus of the given set of buses (Step 204). The insertion of repeaters at power-delay optimal locations is ensured by maintaining sharp transition edges and ensuring that the wire directly hits the repeater pin, which is necessary due to small repeater window size. These critical buses will suffer minimum route detours and no metal layer jumps to access the repeaters, and will have the best performance.

Next, a heuristic approach is used to progressively relax input transition time, repeater window size, and metal crossing constraints to allocate repeaters. At Step 206, a determination is made as to whether repeater assignment is complete. If repeater assignment is complete, the process ends. If repeater assignment is not complete, the initial constraints are relaxed to form a new set of constraints for a new set of buses, i.e., the remaining lower priority buses (Step 208). One or more repeaters are then assigned to each of the new set of corresponding buses based on the relaxed constraints (Step 210). This approach allocates high cost repeater resources to high priority buses to give them optimal timing solutions, preferential access to repeater resources, and guaranteed repeater route connections. Steps 208 and 210 may be repeated until all buses requiring repeaters have had repeaters assigned. Thus, as these resources are exhausted, the process of matching lower cost resources of sub-optimal repeaters to lower priority buses continues, and the process is continued until all global buses are solved with repeaters.

Figure 3:
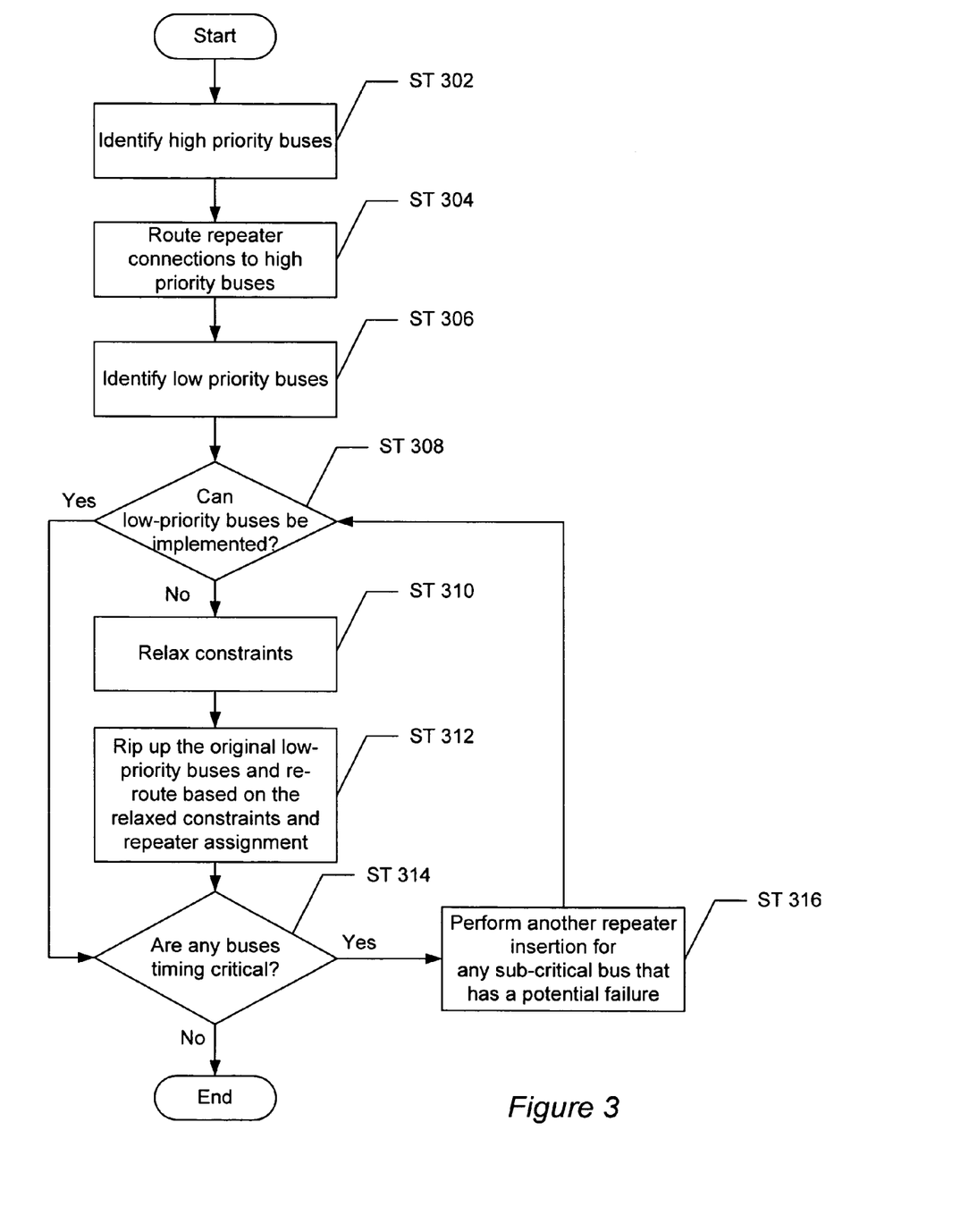
FIG. 3 shows a method for repeater insertion in accordance with one or more embodiments of the invention.

FIG. 3 shows a method for repeater insertion in accordance with one or more embodiments of the invention. In this method, high cost optimal repeater solutions are assigned to high priority critical buses (explained in detail with reference to FIG. 4A). For select categories of buses, the original bus route is preserved and small segments of wire near the repeaters are cut away and wired to the repeaters. In other words, repeater routes are formed and the bus is not re-routed to accommodate for the repeater. As changing a bus wiring affects the correlation with other buses and overall bus performance, bus wiring is not changed at this time. Thus, only small segments of a given bus are re-routed to hook up repeaters, ensuring a high degree of repeater route predictability for these categories of high priority and critical buses.

In FIG. 3, high priority buses are first identified (Step 302) and repeater connections are routed to the high-priority buses (Step 304). Lower priority categories of buses are typically assigned very low cost repeater resources. This means that the repeater solution for a lower priority category of bus might be too far from the bus, or that the repeater route might not be implementable due to bus route congestion. As a result, it is likely that the repeater route will suffer poor timing performance. Thus, in step 306, low-priority buses are identified, and a determination is made as to whether the low-priority buses can be implemented (Step 308).

To obviate poor timing performance, a technique known as "repeater driven rip-and-reroute" is used to solve repeaters on these buses. In this technique, input transition time, repeater window size, and metal crossing constraints are relaxed to allocate low cost repeater solutions to sub-critical buses (Step 310). Then, large parts of the original low-priority bus routes are removed, or ripped up for each of these sub-critical buses. In other words, in one or more embodiments of the invention, the bus is removed from the original bus route. Then, an additional routing pass is run to reroute these buses based on the relaxed repeater assignment (Step 312). The approach rips-and-reroutes selected low priority bus routes to connect them better to low cost repeater solutions and closes the route without affecting timing performance too adversely. In other words, after the bus is removed, a repeater solution is used to determine which bus route to take. Thus, a solution for low-priority bus routes is determined based on repeater availability.

After repeater resource assignment, the repeater connections are routed in the IC. Due to bus route congestion, some of these routes take "scenic detours," or are downgraded to lower metal layers having poorer performance. A scenic detour is an inefficient path connecting a repeater to a bus, which may occur while repeater routing in a highly route congested region. Accordingly, high priority timing-critical buses that are routed in this manner are identified and fixed by re-routing with more stringent constraints.

The remaining sub-critical buses, including any buses that have been re-routed, may potentially fail timing constraints due to excessively bad transition times. These are fixed by doing a second-pass repeater insertion. Thus, these sub-critical buses are checked for potential failures (Step 314). In other words, in Step 314, a determination is made as to whether any bus is timing critical, and whether potential failures exist on one or more sub-critical buses. If it is determined that a bus is timing critical (i.e., a potential failure is determined to exist on a bus), a secondary repeater insertion is performed for that bus (Step 318). In other words, the repeater inserted-and-routed design is fed again into the repeater insertion tool to solve repeaters on the scenic or downgraded bus routes. In this manner, another repeater may be inserted into the sub-critical bus.

Figure 4A:
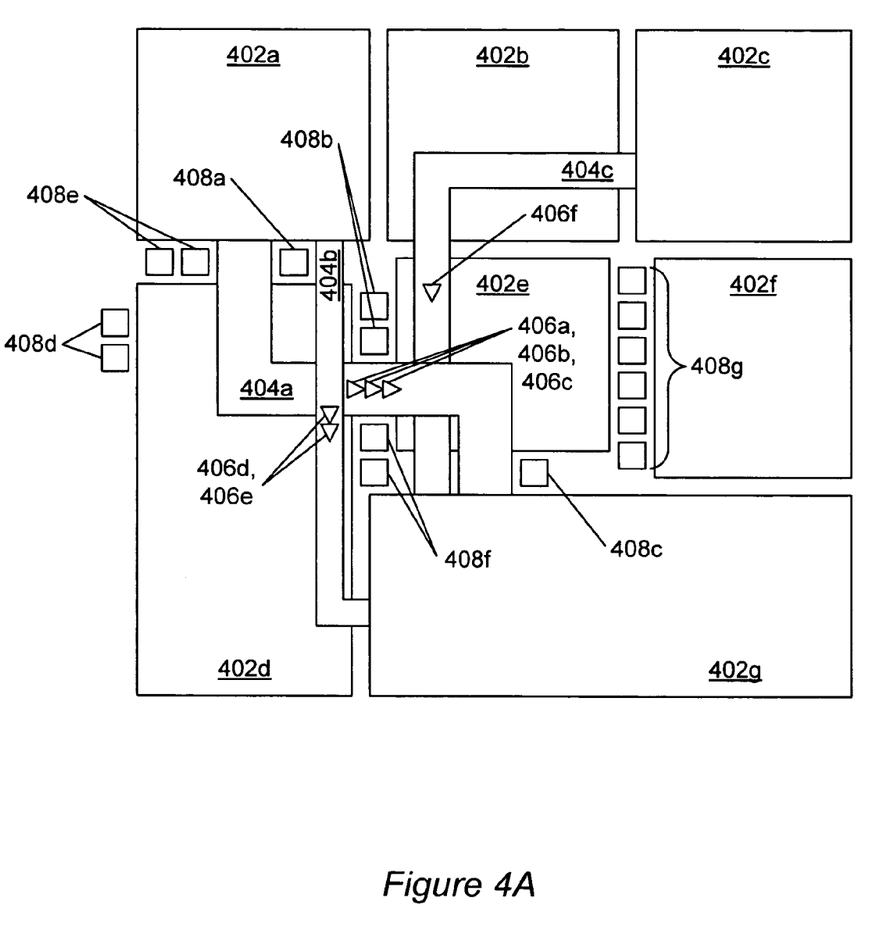
FIG. 4A shows an exemplary integrated circuit in accordance with one or more embodiments of the invention.

FIGS. 4A-4D show stages in the design of an integrated circuit in accordance with one or more embodiments of the invention. FIG. 4A shows a number of functional blocks ("clusters") 402a, 402b, . . . , 402g. Bus 404a connects functional block 402a to functional block 402g. Similarly, bus 404b connects functional block 402a to functional block 402g, and bus 404c connects functional block 402c to functional block 402g. Bus 404a has 3 buffer designations 406a, 406b, 406c, indicating that bus 404a is a "high" priority bus. Similarly, bus 404b has 2 buffer designations 406d, 406e, indicating that bus 404b is a "medium" priority bus, and bus 404c has 1 buffer designation 406f, indicating that bus 404c is a "low" priority bus. Although the priority designations "high," "medium," and "low" have been used with respect to buses 404a, 404b, 404c, a different number of designations could be used without departing from the scope of the invention.

A number of factors may influence the priority of a bus. For example, a bus might be timing critical due to an excessive delay in launch time from the driving cluster or an excessively stringent required arrival time from the receiving cluster. In one or more embodiments of the invention, the priority of a bus influences the metal layer used for the bus in a multilayered integrated circuit. For example, a bus that is assigned a "high" priority in one or more embodiments of the invention may be placed in metal layers 8 and above in an integrated circuit. Further, a bus that is assigned a "medium" priority in one or more embodiments of the invention may be placed in metal layers 5-7 in an integrated circuit. Similarly, a bus that that is assigned a "low" priority in one or more embodiments of the invention may be placed in metal layers 4 and below in an integrated circuit. One skilled in the art will appreciate that while priorities of buses have been assigned to particular metal layers as described above, these assignments are not limited as described. Rather, a determination is made by a designer as to what priority buses are assigned to particular metal layers. For example, in another embodiment of the invention, a bus that is assigned a "medium" priority may be placed in metal layers 4-8 in an integrated circuit. Based on at least in part on bus length and the determined priority of a bus, a designer estimates how many repeaters are needed, and where they are needed, for that bus.

Similarly, in one or more embodiments of the invention, the metal layer up to which a repeater blocks other signals in a multilayered integrated circuit may influence the cost of the repeater. For example, repeaters with metal layer 8 pins and above in an integrated circuit are assigned a "high" cost in one or more embodiments of the invention. These are referred to as high-cost repeaters due to the fact that the placement of their pins at a high metal layer may obstruct metal routes in lower layers. Further, these high-cost repeaters are located close to high-priority buses and can be accessed easily (i.e., with few jumps between metal layers). A high-priority net typically receives a high-cost repeater in a nearby metal layer.

Further, repeaters in metal layers 5-7 in an integrated circuit are typically assigned a "medium" cost in one or more embodiments of the invention. Similarly, repeaters in metal layers 4 and below in an integrated circuit are assigned a "low" cost in one or more embodiments of the invention. Thus, the cost of a repeater is determined based on, in part, the proximity of the repeater to a given bus, how easy the repeater is to access, and how close pin access on the repeater is to a given bus. As described above with respect to buses, these assignments are not limited to the above description, but rather, are determined by the designer of an integrated circuit.

Further, while a repeater may be assigned a given cost in an integrated circuit, if that repeater is not matched to a bus of the matching priority, it may still be used for a lower priority bus when convenient. For example, a high priority repeater that is not first used for a high priority bus when high priority buses are assigned repeaters may instead be used for a medium or low priority bus.

A number of repeater banks 408a, 408b, . . . , 408g lie in areas of the integrated circuit not occupied by functional blocks. Repeaters in these repeater banks are used to strengthen signals carried on buses. Repeater banks 408a, 408b, 408c are designated as "high" priority repeater banks, repeater banks 408d, 408e, 408f are designated as "medium" priority repeater banks, and repeater bank 408g is designated as a "low" priority repeater bank.

Figure 4B:
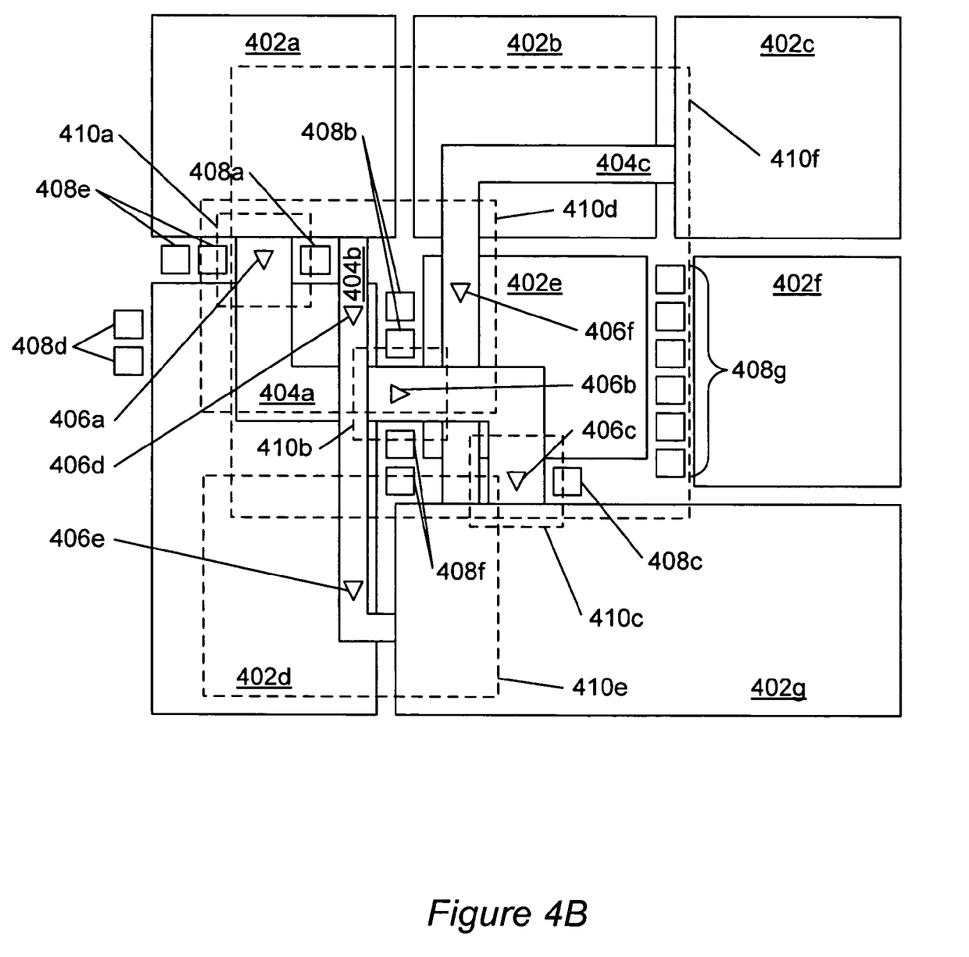
FIG. 4B shows an exemplary integrated circuit in accordance with one or more embodiments of the invention.

FIG. 4B shows the integrated circuit shown in FIG. 4A at a later stage in the design process. In FIG. 4B, repeater designations 406a-406f have been adjusted to show an approximate position on the bus 404a, 404b, 404c to which they are to be connected. Further, windows 410a, 410b, . . . , 410f have been placed around repeater designations 406a-406f relative to the priority of each repeater designation. Window size designates how far from a given repeater a bus assigned to it can be, in three-dimensional space. Thus, a larger window indicates that a repeater may be located further from the bus in a given metal layer (i.e., a distance in length or width from the repeater) or across metal layers (i.e., a distance in depth from the repeater). For example, repeater designation 406a, designated as a "high" priority repeater designation, has a small (8 μm) window 410a placed around it. Similarly, repeater designation 406d, designated as a "medium" priority repeater designation, has a medium-sized (20 μm) window 410d placed around it, and repeater designation 406f, designated as a "low" priority repeater designation, has a large (40 μm) window 410f placed around it. Windows 410a-410f indicate to a designer what repeaters from repeater banks 408a-408g may be used for each repeater designation.

Figure 4C:
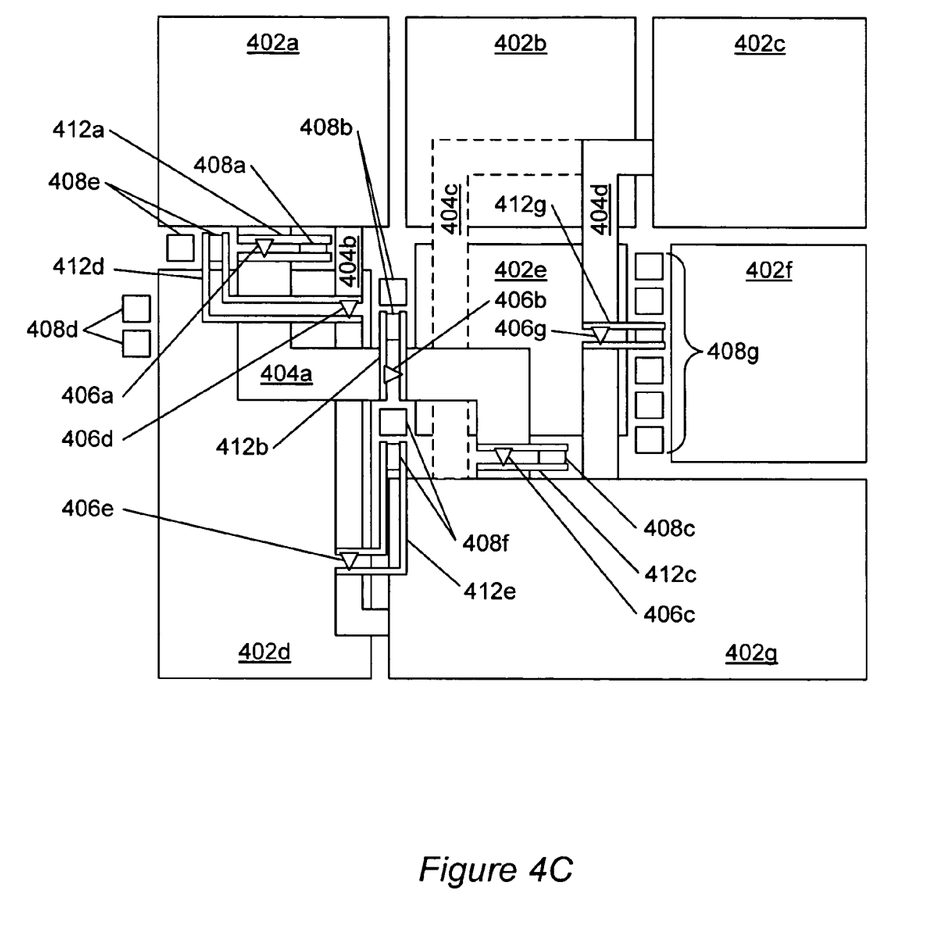
FIG. 4C shows an exemplary integrated circuit in accordance with one or more embodiments of the invention.

FIG. 4C shows the integrated circuit shown in FIG. 4B at a later stage in the design process. In FIG. 4C, buses 404a, 404b have had repeaters from repeater banks 408a-408g connected to repeater designations 406a-406e. Further, bus 404c has been ripped up and re-routed as bus 404d. Because of this, wires 412g connecting bus 404d to repeater block 408g are shorter than if bus 404c had not been re-routed. This is known as a repeater-driven route approach.

Figure 4D:
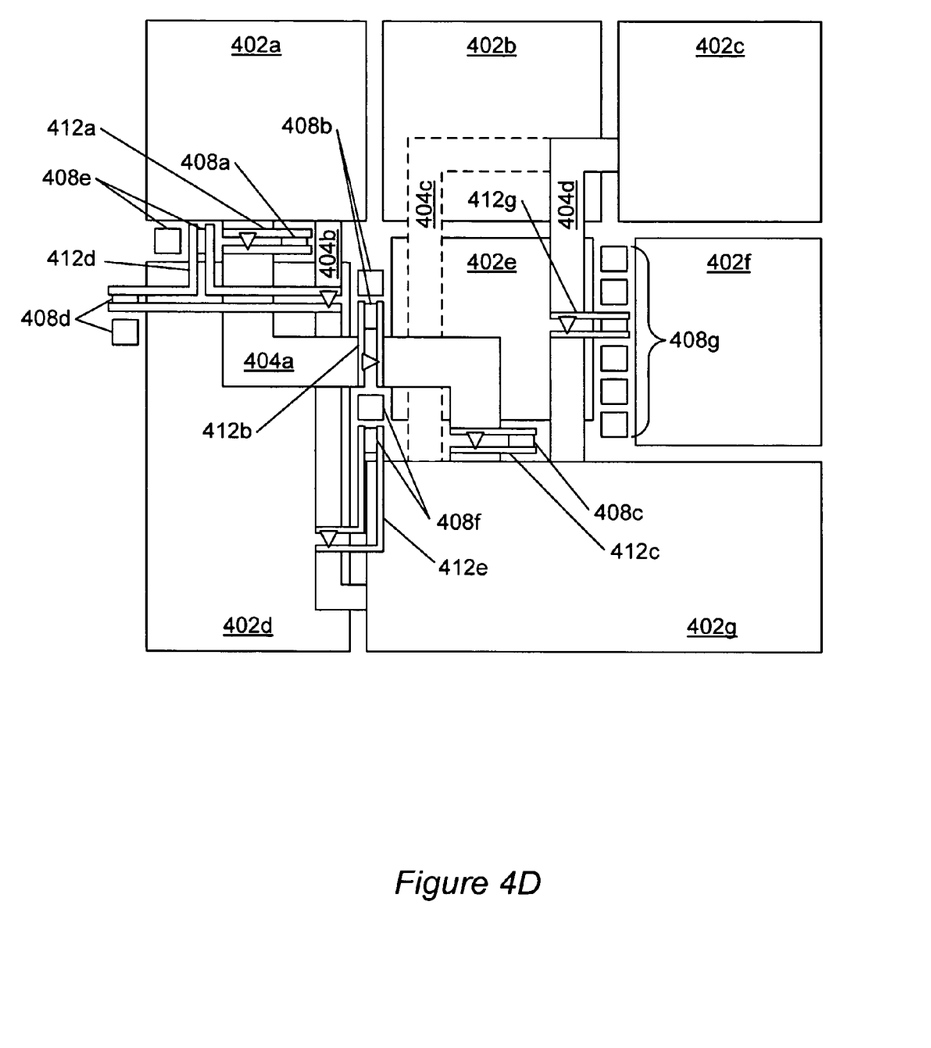
FIG. 4D shows an exemplary integrated circuit in accordance with one or more embodiments of the invention.

FIG. 4D shows the integrated circuit shown in FIG. 4C at a later stage in the design process. In FIG. 4D, wires 412d, which had routed a repeater from repeater bank 408e to bus 404b, now also route a repeater from repeater bank 408d to bus 404b. In other words, a repeater from a plurality of repeater banks 408d, 408e is now connected to bus 404b.

Inefficient bus routes, such as the route taken by wire 412d, and all bus information associated with inefficient routes is fed back into a repeater insertion tool. In the repeater insertion tool, the repeater, the bus, and the wire are treated as a single net. Thus, if determined necessary by the repeater tool, another repeater may be inserted in the bus or in the wire path already connecting a repeater to a bus (i.e., a repeater from repeater bank 408d). This approach helps solve, for example, for a poor slew rate in the bus.

Figure 5:
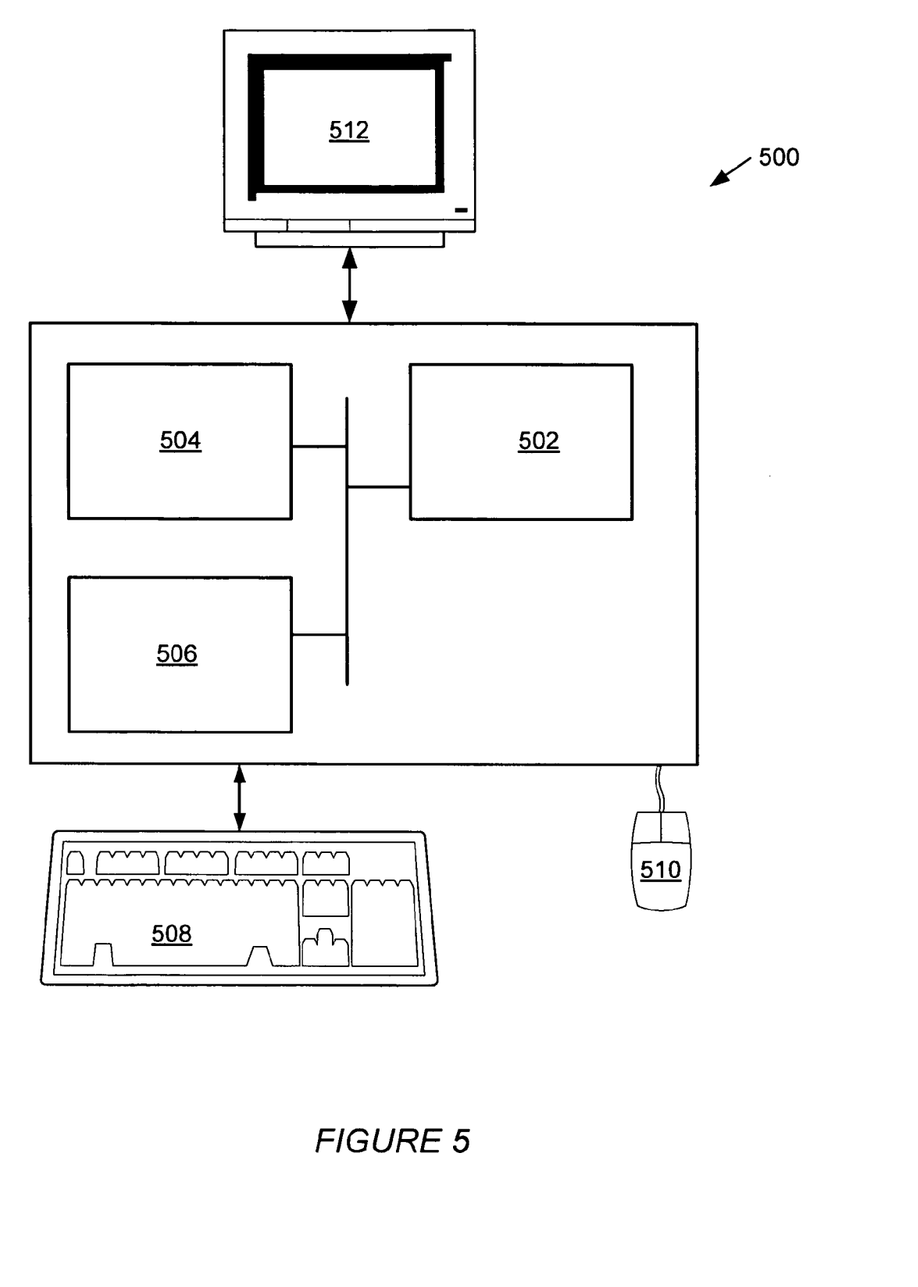
FIG. 5 shows an exemplary computer system in accordance with one or more embodiments of the invention.

The present invention may be implemented, at least in part, on virtually any type of computer system, regardless of the platform being used. For example, as shown in FIG. 5, a networked computer system 500 includes a processor 502, associated memory 504, a storage device 506, and numerous other elements and functionalities typical of a computer (not shown). The networked computer 500 may also include input means, such as a keyboard 508 and a mouse 510, and output means, such as a monitor 512. The networked computer system 500 is connected to a local area network (LAN) or a wide area network (e.g., the Internet) (not shown) via a network interface connection (not shown). These input and output means may take other forms. Further, software instructions to perform embodiments of the invention may be stored on a computer readable medium such as a compact disc (CD), a diskette, a tape, a file, or any other computer readable storage device.

Advantages of one or more embodiments of the invention may include one or more of the following. In one or more embodiments of the invention, a method for assigning repeaters converges quickly on a repeater, bus route, and timing solution using a heuristic approach.

In one or more embodiments of the invention, high-priority critical buses are matched to high cost repeater resources and low-priority sub-critical buses are matched to low cost repeater resources, thereby assigning repeaters to signal buses in an optimal fashion. Accordingly, in one or more embodiments of the invention, route structure is preserved for high-priority buses, resulting in good signal-repeater bus route correlation. Additionally, in one or more embodiments of the invention, low priority buses are rerouted to minimize performance penalties of sub-optimal repeater solutions.

In one or more embodiments of the invention, signal route structure is preserved for high priority buses and low priority buses that receive sub-optimal repeater solutions are rerouted. Further, in one or more embodiments of the invention, a solution for repeaters, bus routes and timing in an integrated circuit is converged upon by automatically inserting additional repeaters in scenic and low level metal bus routes.

In one or more embodiments of the invention, a solution for repeaters, bus routes, and timing in an integrated circuit is converged upon, rather than working in an iterative fashion. Accordingly, in one or more embodiments of the invention, a solution may be efficiently converged upon given the tight constraints of an integrated circuit with a limited channel area floor plan.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for inserting repeaters in an integrated circuit, comprising:
    establishing a set of initial constraints;
    identifying a high-priority bus and a repeater designation on the high-priority bus;
    creating a first repeater window that includes the repeater designation on the high-priority bus based on the initial constraints;
    assigning a first repeater, located within the first repeater window, to the repeater designation on the high-priority bus based on the set of initial constraints;
    identifying a lower-priority bus and a repeater designation on the lower-priority bus;
    relaxing the set of initial constraints to form a set of relaxed constraints for the lower-priority bus;
    creating a second repeater window that includes the repeater designation on the lower-priority bus based on the relaxed constraints;
    assigning a second repeater, located within the second repeater window, to the repeater designation on the lower-priority bus based on the relaxed constraints; and
    routing assigned first and second repeaters to each of the corresponding buses in the integrated circuit.

2. The method of claim 1, further comprising:
    estimating an ideal location for at least one repeater;
    building a map of repeater locations and bus routes to be solved based on the ideal location estimation for at least one repeater;
    routing a plurality of signals in a priority order; and
    designing at least one custom repeater bank, and
    placing the at least one custom repeater bank based on routing constraints.

3. The method of claim 2, further comprising:
    performing initial bus planning on a floor plan of the integrated circuit.

4. The method of claim 3, wherein bus planning is affected by at least one selected from the group consisting of bus wire lengths, a proximity of a repeater corresponding to a critical bus, and space for a repeater bank.

5. The method of claim 2, wherein routing the plurality of signals comprises:
    sorting the signals into bins based on an assessed priority of the signals.

6. The method of claim 1, further comprising:
    identifying the high-priority bus wherein repeater connections to the high-priority bus are routed on lower metal layers; and
    rerouting the high-priority bus with a more stringent constraint,
    wherein a more stringent constraint comprises at least one from the group consisting of a shorter input transition time, a smaller repeater window size, and a smaller metal crossing constraint.

7. The method of claim 1, further comprising:
    determining whether potential failures of a sub-critical bus exist; and
    assigning and routing a secondary repeater for the sub-critical bus when potential failures on the sub-critical bus are determined to exist.

8. The method of claim 1, further comprising:
    relaxing at least one constraint comprising at least one selected from the group consisting of a longer input transition time, a larger repeater window size, and a larger metal crossing constraint;
    removing the low priority bus from an original bus route;
    re-routing the removed low priority bus dependent on the at least one relaxed constraint; and
    inserting another repeater for the re-routed low priority bus when the re-routed low priority bus is determined to have a potential failure.

9. The method of claim 1, wherein the integrated circuit is a channel-limited, system-on-chip microprocessor.

10. The method of claim 1, wherein the set of initial constraints comprises at least one from the group consisting of an input transition time, a repeater window size, and a metal crossing constraint.

11. The method of claim 7, wherein the secondary repeater is not within a repeater window of the sub-critical bus.

* * * * *